United States Patent
Cannon (10) Patent No.: US 6,949,919 B1
(45) Date of Patent: Sep. 27, 2005

(54) UNBREAKABLE MICRO-BROWSER

(75) Inventor: James E. Cannon, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/834,549

(22) Filed: Apr. 28, 2004

(51) Int. Cl.$^7$ .............................................. G01R 31/02
(52) U.S. Cl. ...................... 324/72.5; 324/149; 324/754
(58) Field of Search ............................... 324/72.5, 754, 324/149; 73/886.5

(56) References Cited

U.S. PATENT DOCUMENTS 4,414,506 A * 11/1983 Kelley ......................... 324/754

OTHER PUBLICATIONS

Inventor Rebecca N. Cullion title "Method And Apparatus For Differential Test Probe Retention With Compliant Z-Axis", U.S. Appl. No. 10/208,641; filed Jul. 30, 2002.

* cited by examiner

Primary Examiner—Vincent Q. Nguyen
(74) Attorney, Agent, or Firm—Edward L. Miller (57) ABSTRACT

A solution to the problem of broken micro-browser probe assemblies caused by the accidental application of excessive force is to manufacture the rods out of a material that resists forces found in normal usage and appears stiff, but that will abruptly deform harmlessly under less force than causes permanent damage to other elements of the micro-browser. The sudden deformation serves as a signal to the operator to stop being a gorilla. That leaves the problem of re-shaping the rod. A preferred solution is to use as the rod a Nitinol superelastic metal wire that automatically returns to its previous shape once the force causing deformation is removed. An alternate solution is to make the rod from a length of Nitinol "memory metal" wire that restores itself to a pre-set shape upon the application of mild heat, such as immersion in a cup of hot water from an office coffee machine. The small circuit board and its components are not bothered by the bath. In each case the diameter of the wire is selected to make the wire be strong enough to not deform under normal use, but to allow it to abruptly deform under less force than will damage the other elements in the micro-browser.

26 Claims, 6 Drawing Sheets

UNBREAKABLE MICRO-BROWSER

BACKGROUND OF THE INVENTION

Many types of electronic test equipment (e.g., oscilloscopes) often involve the probing of a circuit of interest with a hand held probe. The probe might acquire a single-ended signal or a differential one, and there may or may not be a ground connection using a "flying lead" (a short length of flexible insulated wire with an alligator clip or other fastener at the free end). In particular, it is often necessary to probe the signals at two places on a PCB (Printed Circuit Board) that: (1) Are some arbitrary distance apart; (2) Are traces leading to surface mounted components with no leads around which a probe tip may be hooked, requiring that sharp probe tips be pressed into those traces; and (3) Carry signal that have high frequency components (say, in the Giga Hertz region).

To accomplish these tasks a number of desirable properties of such a probe have been identified, and various designs have been offered. These desirable properties include adjustable spacing between a pair of small sharp probe tips with spring loading. They are small to cooperate with high frequency operation. They are sharp to allow them to penetrate any protective coatings and stay in place by slightly gouging into the trace. At least one is spring loaded to help them stay in place and not slip, even though the operator's hand may move or wiggle slightly during the measurement.

A prior art micro-browser meeting these requirements has pair of rods each entering a corresponding bore in a sleeve that retains them, and that may itself be carried by a grip shaped to be rotated between a thumb and a finger. The edge of a small circuit board is soldered at the distal end of the rod. One of the rods is allowed to rotate within its bore in the sleeve, while the other is held stationary by a notch in the sleeve. The rotatable rod has a captive spring that resists the force of probe contact. Each board carries a coupling network connected to a short sharp probe tip bent downward and away from the plane of its board. The probe tips are offset from the axes of the rods, allowing the distance between the probe tips to be a function of the amount of rotation. The other end of each coupling network is coupled to a short length of a respective 50 Ω coaxial cable that passes through an axial slot in the grip to enter an amplifier pod that drives a main cable leading to test equipment. The rods may be held within the bores by friction created by slight bends in the rods. The circuit boards each include shields connected together at a location that is as close as possible to the probe tips by arranging that the rods touch each other near the probe tips. If the rods are parallel, then there is a slight bend in the non-rotating rod at the location where it passes the non-probe-carrying edge of the circuit board, such that its tip touches the tip of the rotatable rod. If the rods are both straight, then the axes of the rods are coplanar but convergent proximate the probe tips.

In operation, the spring loaded rotatable probe tip is pressed against an intended location. Once contact is made with the rotatable probe tip, further rotation of the grip also rotates the sleeve, which in turn causes an eccentric rotation of the stationary probe tip that varies the spacing between the two probe tips (the two probe tips are not along extensions of the axes of the rods). By moving the grip in a circular path (orbiting) without rotation the general orientation of the stationary probe tip relative to the other can be controlled. When both the correct spacing and the correct general orientation are achieved by a combination of orbiting and rotation, the stationary probe tip will then be positioned above the other location to be probed. A "tilting" of the entire micro-browser without further rotation or orbiting will lower the stationary probe tip onto the target location.

It is anticipated that the prior art micro-browser mentioned in the preceding paragraphs will be usable up to 10 or 12 GHz. Accordingly, it is small; the circuit boards are about 0.110" wide and only 0.400" long. The rods to which these boards are mounted are on the order of ⅟₃₂" in diameter. Its usage model departs considerably from what many operators are used to, and while it does not take long to get used to the manner in which rotation and orbiting are used to achieve probe tip contact, it can take a while for some persons to appreciate that the micro-browser is, well, delicate. Not every user is a clumsy gorilla, but it is hard to make small things strong. In short, bad things happen when the user accidently pushes too hard on the micro-browser.

We have seen bent probes in similar browsers that withstand several pounds of force. Forces in the range of five to six ounces can damage the micro-browser described above.

Failures resulting from excessive contact force include bent rods, broken solder joints that attach the rod to the circuit board, dislodged probe tips and fractured circuit boards. Replacement and repair of micro-browsers that have been damaged through the accidental application of excessive force is a major aggravation for both the manufacturer and his customer. The customer is without the business end of his expensive active probe, while the manufacturer is hesitant to charge the actual cost of replacement (the micro-browser itself has only passive components, is not truly "precision" in the ususal sense of the term, and appears to the user to be mostly a mechanical interface). We need to "gorilla-proof" the micro-browser. What to do?

SUMMARY OF THE INVENTION

A solution to the problem of broken micro-browser probe assemblies caused by the accidental application of excessive force is to manufacture the rods out of a material that resists the forces found in normal usage and appear to be stiff while doing so, but that will abruptly deform harmlessly under less force than that which causes permanent damage to other elements of the micro-browser. The sudden deformation serves as a signal to the operator to stop being a gorilla. That leaves the problem of re-shaping the rod. A preferred solution is to use as the rod a superelastic metal wire that automatically returns to its previous shape once the force causing deformation is removed. An alternate solution is to make the rod from a length of wire of "memory metal" that after deformation restores itself to a pre-set shape upon the application of mild heat, such as immersion in a cup of hot water from an office coffee machine. The family of alloys known as Nitinol, which have nearly equiatomic percentages of nickel and titanium, is available in wire form for each type of behavior. The small circuit board and its components are not bothered by the bath. In each case the diameter of the wire is selected to make the wire be strong enough to not deform under normal use, but to allow it to abruptly deform under less force than will damage the other elements in the micro-browser.

DESCRIPTION OF A PREFERRED EMBODIMENT

Figure 1:
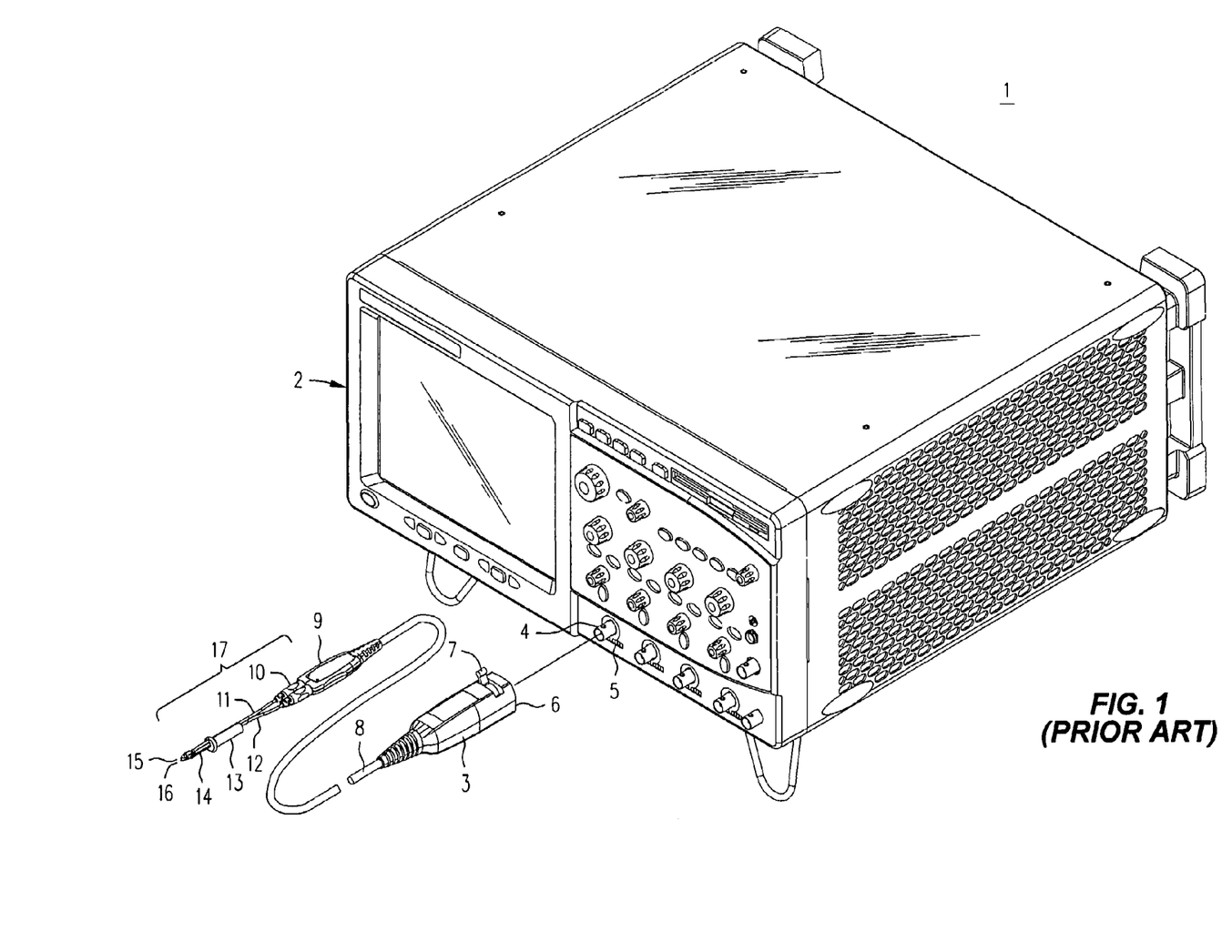
FIG. 1 is a perspective view of a prior art hand held micro-browser for use with a digital oscilloscope.

Refer now to FIG. 1, wherein is shown a front perspective view 1 of an electronic instrument 2, such as a digital oscilloscope, having one or more front panel connectors 4 that receive a push-lock BNC connector 3, say, in support of operation with active probes. In a manner known in the prior art, the push-lock BNC probe housing is installed simply by lining it up and then pushing it toward the 'scope. When the push-lock connector 3 is in place, not only is a BNC connection established to connector 4, but a row of spring loaded pins 6 (not visible) on the front of the housing for the push-lock assembly engages a row 5 of contacts beneath the connector 4. To remove the push-lock connector the operator pushes on lever or tab 7 with a thumb or a finger, while pulling the assembly away from the 'scope. A main cable 8 carries both power to, and signal information from, an amplifier pod 9, which may contain high frequency amplifiers.

A pair of coaxial transmission lines (11, 12) couple a prior art micro-browser 17 to the amplifier pod 9 via a pair of coaxial connectors (10). The micro-browser includes a grip 13 intended to be held between the thumb and forefinger. A sleeve 14 is carried by the grip, and supports a pair of movable small circuit boards each having a probe tip (15, 16). The small circuit boards may be of glass epoxy (FR4) or of ceramic material.

Figure 2:
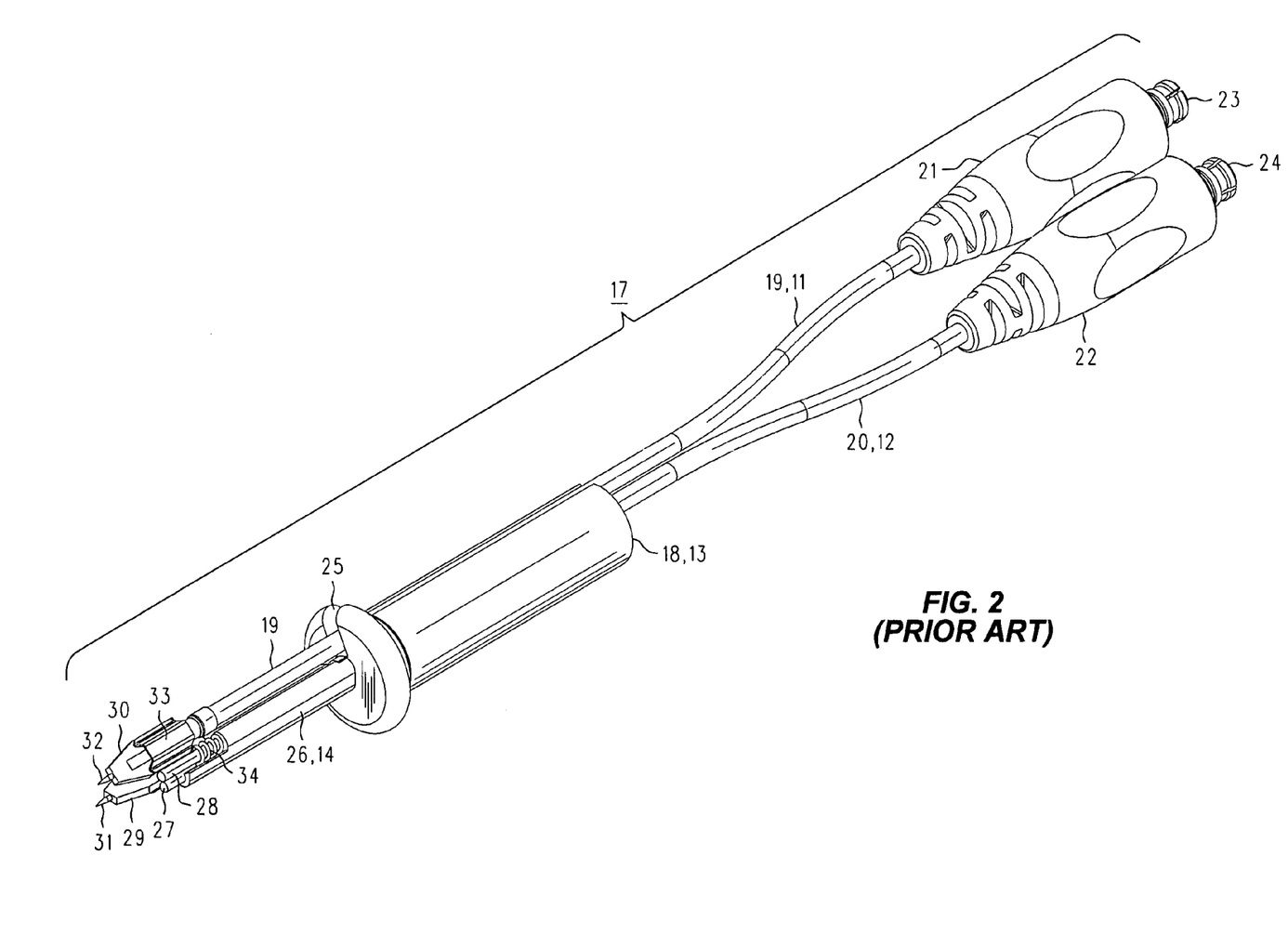
FIG. 2 is a perspective view of the prior art micro-browser of FIG. 1.

Refer now to FIG. 2, wherein is shown an enlarged perspective view of the prior art micro-browser 17 of FIG. 1. The view shows a grip (13, 18) which has received a sleeve (26, 14). Although better shown in FIG. 3, the sleeve 26 has two parallel bores that carry plated brass rods 27 and 28. The ends of the those rods are each soldered to the side of a respective small circuit board, 29 and 30. Each small circuit board carries a coupling network whose physical appearance is better shown in FIGS. 4, 5 and 6, and which is shielded by a conductive cover (or shield) of which only one (33) thereof is visible in FIG. 2. Each of the small circuit boards has a small sharp probe tip (31, 32). The probe tips are electrically connected to an associated coupling network, which is coupled to an associated coaxial cable (19, 20) that may also function as a transmission line. A slot 25 in the grip carries cable 19, while a second slot 42 (visible in FIG. 3) carries the other cable 20.

Rod 28 and its circuit board 30 are free to rotate at least 180° about the axis of the rod. A spring 34 fits over rod 28 and provides resilient resistance to compression between circuit board 30 and the sleeve 26 in a direction along the axis of rod 28. Rod 27 and its circuit board 29 are prevented from rotating by a notch 35 in the end of the sleeve that engages the end of the small circuit board 29 (see FIG. 3).

The two cables 19 and 20 have respective strain relieving boots 21 and 22 that also carry suitable coaxial connectors 23 and 24 that plug into corresponding connectors in the amplifier pod 9.

Figure 3:
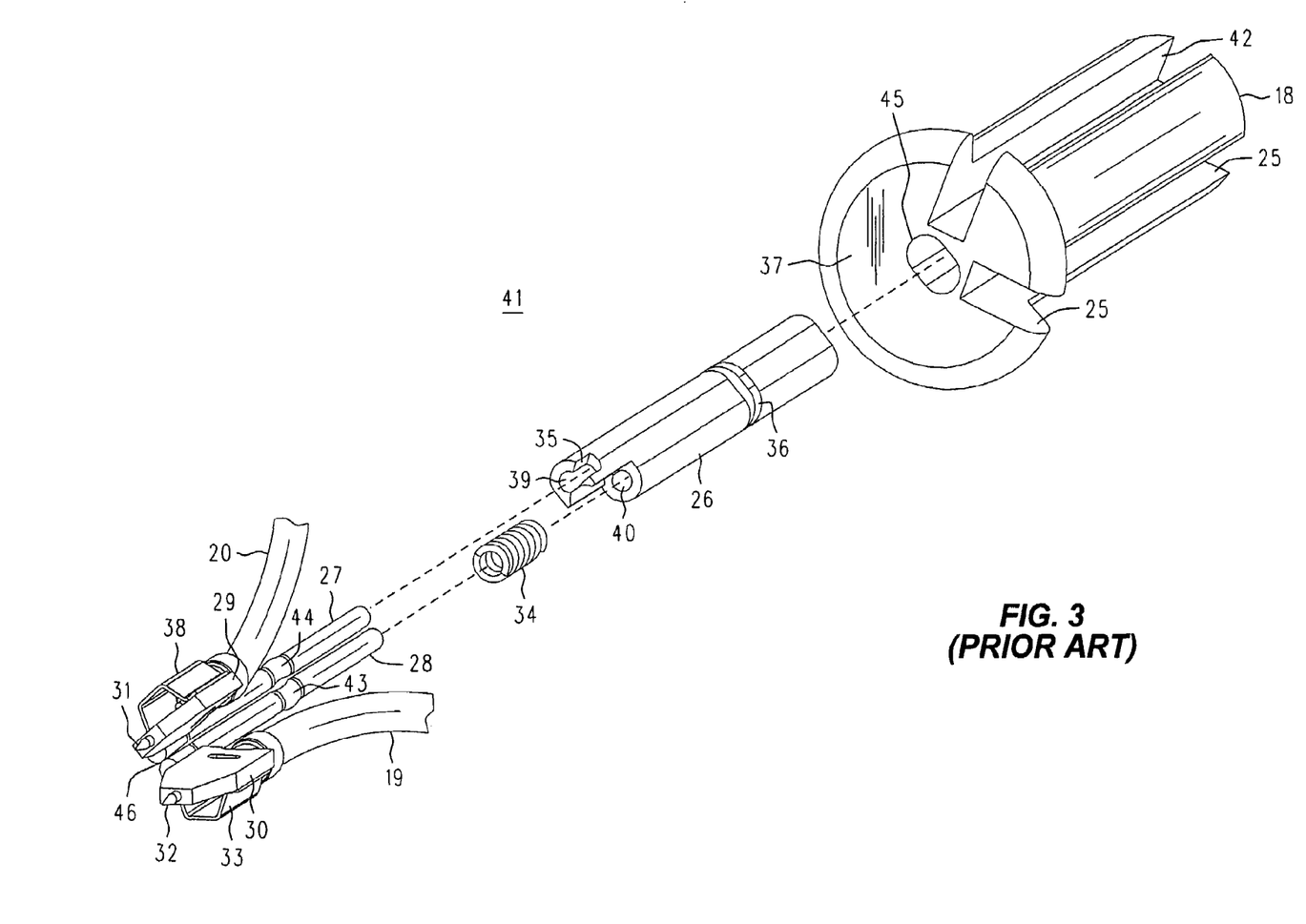
FIG. 3 is an exploded perspective view of the probe tip, circuit board, rod, sleeve and grip portions of the prior art micro-browser of FIG. 2.

Referring now to FIG. 3, we see an exploded perspective view 41 of most of the stuff in FIG. 2. The parts have been rotated about 90° clockwise in FIG. 3, so that slot 42 for cable 20 is visible. Due to the exploded nature of the drawing, the bores 39 and 40 in the sleeve 26 are visible. Bore 39 receives rod 27 while bore 40 receives rod 28. Note bends 43 and 44 in the rods 28 and 27, respectively. These slight hump-shaped bends cause the friction that retains the rods in their bores.

Also visible in the figure is oval shaped bore 45 in the grip 18. It receives the sleeve 26 until stop 36 limits the penetration of the sleeve 26 into the bore 45. Bore 45 may have a slight taper to provide a minor amount of interference with sleeve 26, and thus retain it in the bore by friction. Note that the oval shape of the bore 45 cooperates with a corresponding oval exterior of the sleeve to positively communicate any rotation of the grip to the sleeve.

A notch 35 is visible in FIG. 3 adjacent the aperture of the bore 39. What this does is engage the back side of the small circuit board 29, and cause it to be stationary, or non-rotating about the axis of its bore within the sleeve.

Also visible in FIG. 3 is that the distal ends of the two rods 27 and 28 touch at location 46, despite the majority of the rods being parallel elsewhere along the length of their axes. This touching is also electrical contact, and may be accomplished by a slight bend in the stationary rod 27 toward the rotatable rod and at the location where the stationary rod 27 is attached to the board 29. Thus, no matter the rotation of rotatable rod 28, the two rods continue to touch. This is of significance to the shields 33 and 38, each of which are soldered to a ground supplied by its associated coaxial cable (19 and 20). The idea is to get those two grounds tied together as close as possible to the probe tips.

In an alternate prior art embodiment both of the rods 27 and 28 are straight (save for humps 43 and 44), have axes that are coplanar, but convergent such that the ends of the rods near the circuit boards 29 and 30 are touching. This is condition is obtained by having the axes of the bores 39 and 40 in the sleeve 26 be coplanar, but convergent along the direction toward the probe tips. This coplanar convergent axes embodiment is our preferred starting point for the description that follows, although it will be abundantly clear that the invention may be practiced with the bent stationary rod in a parallel axes embodiment, as well.

In operation, the spring loaded rotatable probe tip 32 is pressed against an intended location. This is done by rotating the grip 18 (and thus the entire micro-browser 12) before any contact is made. Once contact is made with the rotatable probe tip 32, (and assuming there is not yet contact by the other, stationary, probe tip 31) further rotation of the grip 18 also rotates the sleeve 26, which in turn causes an eccentric rotation of the stationary probe tip that varies the spacing between the two probe tips 31 and 32. By moving the grip 18 in a circular path (orbiting) without rotation the general orientation of the stationary probe tip 31 relative to the other (32) can be controlled—think up, down, left and right here, and not so much about distance, although distance will be affected. When both the correct spacing and the correct general orientation are achieved by a combination of orbiting and rotation, the stationary probe tip 31 will then be positioned above the other location to be probed. An angular displacement of the axis of the grip 18 within the plane containing that axis (a "tilting" of the entire micro-browser without further rotation or orbiting) will lower the stationary probe tip onto the target location. The resilience of the movable probe tip's spring 34 will enable that probe tip 32 to continue making contact as the stationary probe tip is firmly pressed into its location with sufficient force to make reliable electrical contact. Once contact is made with both probe tips a reasonable amount of tilting and "rocking" (motion in a direction orthogonal to tilting) can be tolerated without either probe tip coming off (losing contact), provided the single spring remains compressed in response to force from the operator. It is, of course, that force that is of interest to us here. If it is too large, the rods 27 and 28 may bend, the probe tips 31 or 32 break off, one of the boards 29 or 30 might fracture, or the an edge of the notch 35 might fracture.

Figure 4:
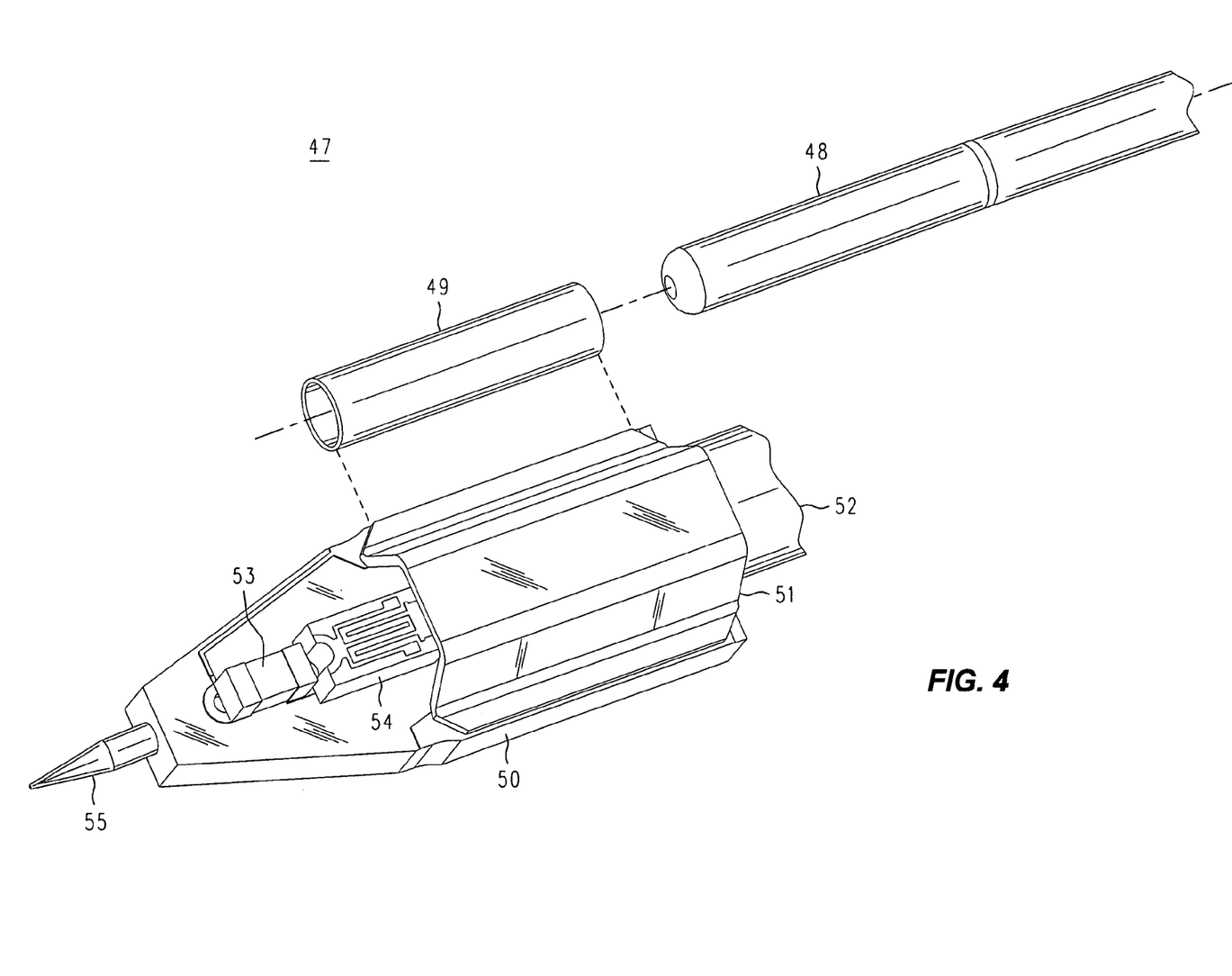
FIG. 4 is a more detailed perspective view of one of circuit boards and rods similar to those of FIG. 3, but that are constructed in accordance with the present invention.

Referring now to FIG. 4, shown therein is a perspective view 47 of a rod 48 with its small circuit board 50. Board 50 and shield 51 are soldered to tube 49 (which might also be termed a socket) along an edge where they meet. It is clear that other socket-like mechanisms can be used besides tubes. Also shown are various of the passive components that comprise a coupling network for the micro-browser. In particular, item 53 is a damping resistor, while item 54 is an RC network that may be laser trimmed after assembly. The shield 51 does not completely cover item 54 to allow just such trimming. The circuit board is small, only about 0.110" wide and about 0.400" inches long, with a height of 0.077", including the shield.

The view 47 in FIG. 4 does not show whether the rod 48 is straight or bent, and for our immediate purposes it does not matter if it is bent or not. The rod 48 may be of the Nitinol material to be discussed below. At present, it is sufficient to appreciate that if it is of the superelastic variety (56% Ni, balance Ti and trace elements) it may be of about 0.015" or 0.018" in diameter, while if of the "memory metal" or "shape memory" variety (54.5% Ni, balance Ti and trace elements) the diameter likely would be larger, say, about 0.030". In either case, the stuff does not plate particularly well, nor does it solder, weld or braze easily (it can be done, but is fussy, requiring non-standard techniques). To attach a rod 48 of Nitinol to the board 50 we glue it (epoxy works, as does cyanoacrilate—'super glue') into a suitable diameter tube 49 of stainless steel that has been gold plated and was then soldered to the board 50 and its shield 51. The gold plating assists the soldering and also ensures good ohmic contact between the tubes (49 & 59—see FIG. 6) where they touch (63 in FIG. 6).

There is yet another reason for this arrangement using the tube 49. The tubing is pretty strong stuff, and really resists bending. This keeps the end of the solder joint at the non-probe tip end of the board 50 from experiencing undue stress that it would see if the rod 48 were soldered directly to the board. A directly soldered rod 48 would use the board as a stiffener that locates one end of a bend induced by excessive operator force, and a propagating tear in the solder joint could result. The stainless steel tube 49 does not bend under that force, and thus acts as a load spreader over the entire solder joint.

Figure 5:
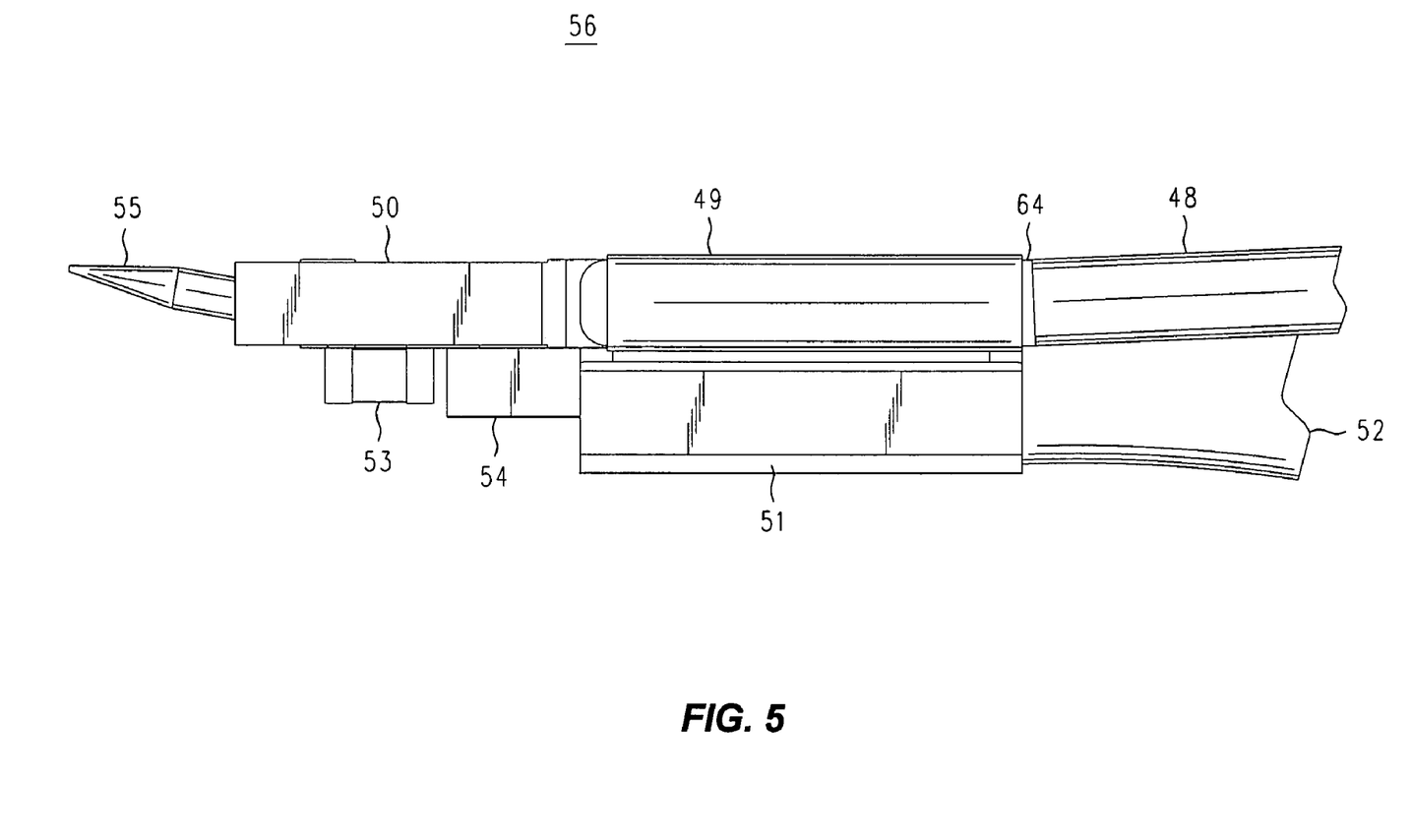
FIG. 5 is a side view of the circuit board and rod of FIG. 4, wherein one permanently bent rod is used to make the rods touch at their tips.

FIG. 5 is a side view 56 of what is shown in FIG. 4, and allows a better view of the location 64 and direction of the bend in rod 48 that allows tube-to-tube contact at location 63 (see FIG. 6), and of the manner in which the tip 55 is disposed at an angle to the plane of the circuit board 50. Of course, rod 48 might not be bent at location 64, and for a view of the straight rod embodiment we turn to FIG. 6.

Figure 6:
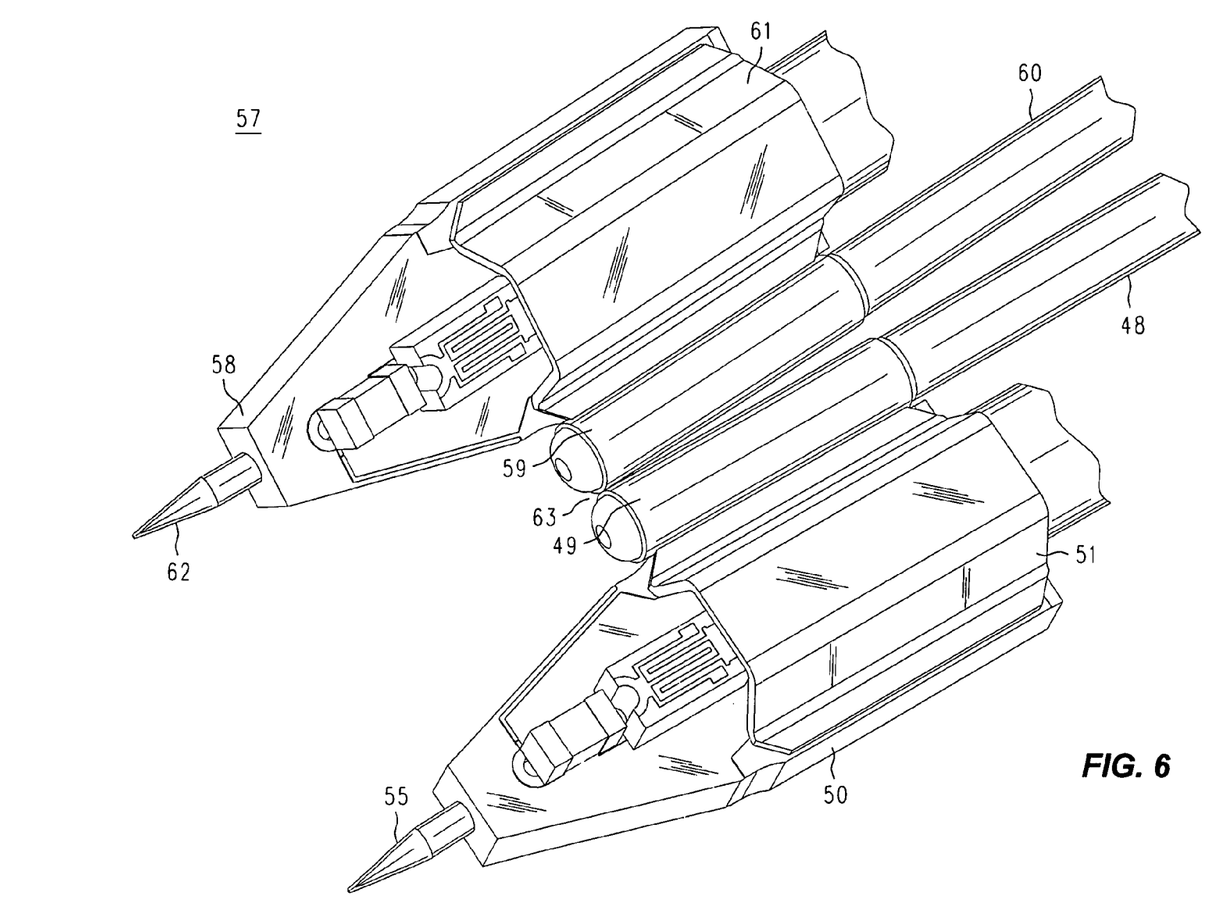
FIG. 6 is a perspective view of a pair of circuit boards and rods such as those of FIGS. 3 and 4, but wherein the rods are both straight, their axes are coplanar and convergent at the ends of the rods near the probe tips.

FIG. 6 is a perspective view 57 of a pair of straight Nitinol rods 48 and 60 that have been glued into tubes 49 and 59, respectively. The nature of tube 49 and how it has been attached to board 50 and its shield 51 have been described in connection with FIG. 4. Similar remarks apply to tube 59 and its associated board 58 and shield 61. Once again, we point out that the reason for having the two tubes 49 and 59 in physical (and thus also electrical) contact is so that the shields 51 and 61 will be electrically common at a physical location as close as practical to the probe tips 55 and 62. This is good RF practice for circuits that are expected to operate at very high frequencies.

To summarize the difference between the bent rod embodiment (FIG. 5) and the straight rod embodiment (FIG. 6): The bent rod embodiment uses one straight rod and one bent rod bent as shown at location 64 of FIG. 5, and has a sleeve 26 whose bores 39 and 40 have axes that are not only coplanar, but also parallel. The straight rod embodiment uses two straight rods, but the axes of the bores 39 and 40 are only coplanar and non-parallel; they are convergent at about location 63.

In either embodiment, it may be desirable for the rods, whether straight or bent, to include the hump-shaped bends 43 and 44 that are shown in FIG. 3. They are just temporary departures from the axes of the rod designed to introduce friction for retention of the rods in their bores, and do not affect how the rods touch at location 46 (FIG. 3) or 63 (FIG. 6).

And now for a discussion of the rods themselves, whether straight or bent, and with or without the hump-shaped bends. It is preferred that they be of Nitinol. Nitinol is the descriptive name for a family of alloys of nearly equal atomic percentages of nickel and titanium. While earlier copper based shape memory alloys (SMAs) were known from 1932, the more commercially successful nickel-titanium family (Ni—Ti) of SMAs were discovered at the Naval Ordinance Laboratory (NOL) in the early 1960s. Hence the name "Nitinol," which is also sometime found as NiTinol or NiTiNol. Traces of carbon, oxygen and hydrogen are present, as is sometimes a small amount of another element. One authority says that carbon and oxygen are contaminants, and should be excluded if possible. Quoting now from a data sheet:

"Nitinol exhibits a thermoplastic martensitic transformation. This transformation is responsible for either shape memory or superelasticity being exhibited by the alloy.

Following deformation below the transformation range, the ability called shape memory allows recovery of a predetermined shape upon heating above the transformation range. Superelasticity is the ability to recover a shape upon removal of an applied stress over a narrow range of deformation temperatures. The strain recovered with shape memory or superelasticity provides nearly ten times the elastic springback of other alloys such as stainless steel."

So, there are two broad types of Nitinol available: superelastic stuff and shape memory stuff. In wire form the shape memory version has been called memory wire. The metallurgy literature refers to "shape memory alloys" (SMAs). In each case the Nitinol can be made to assume a set shape by holding in that shape while it is heated until it softens (at a "setting" temperature), and then allowed to cool slowly. After it has cooled it will remember that shape. The difference between the two appears to be that the superelastic version does not readily undergo deformation at room temperatures, but springs back to its set shape upon removal of the stress that causes it to bend. The memory shape version does deform, but will return to its set shape upon the application of mild heat (the "transformation" temperature) that is much less than that used to soften it to take a set. It appears that the shape memory stuff has a transformation temperature higher than room temperature (where human beings tend to use things), while the superelastic stuff has a transformation temperature lower than room temperature, and never stays deformed because it is "always" returning to its set shape. For a given set the deformations and restorations can occur many times.

Experiments with the superelastic version (56% Ni) in wire form, using short lengths of the wire as rods for the micro-browser, have shown that a wire diameter in the range of 0.015" to 0.018" is satisfactory. If shape memory is used (54.5% Ni), then 0.030" appears to be a good diameter. It will, of course, be appreciated that different manufacturers of Nitinol may offer various recipes for the alloy, and that those may vary in more ways than just the ratio of Ni to Ti, with the attendant need to experiment slightly to see what works best for a particular situation.) The diameter determines how much force the operator can apply to the micro-browser before the rods deform (bend) as a warning to push no harder and to limit the forces applied to the other parts of the micro-browser. In one actual micro-browser the Nitinol rods limit the applied force to about three and one half ounces (the damage level is somewhere in the four to five ounce range). The location of the deformation is generally a bend just above the stainless steel tube. If the superelastic Nitinol is used, the bend/deformation will vanish in favor of the original shape as soon as the operator stops pushing. If the shape memory Nitinol is used, the affected rod/board needs to be dunked in hot (not even boiling) water, such as what is provided by office coffee machines. (Other sources of heat may be used, such as the proximity of a soldering iron, but hot water is nearly always readily available and is perhaps safer to use.) The return to the original set shape is nearly instantaneous, and regular production practices for what is on the board prevent any damage to the board's components. (It is usual for the board to get washed in hot water after production soldering, anyway, and then to receive hydrophobic coatings, etc.)

It will be appreciated that any permanent bends, such as the hump-shaped bends 43 and 44, or the "make contact" bend at 64, are put in the rod of Nitinol as part of the permanent shape of the rod. In particular, a cut length of the stuff is placed into a jig that enforces the bends while the length is heated to the temperature (approximately 500° C. . . . way hotter than coffee water!) at which it softens and then takes the set when allowed to cool slowly. Because of the wide difference in temperatures, there is no chance that a user will accidentally give a deformed rod of the shape memory Nitinol a new permanent shape different from the one given at the micro-browser factory.

The reader is referred to the detailed description of Nitinol handling in the literature, e.g., Binary Phase Alloy Phase Diagrams, 2nd Ed. Vol. 3, published by William W. Scott, Jr., or, the ASM Handbook, Vol. 2, 1990. A particularly good collection of informative papers is the JOHNSON MATTHEY NiTi Smart Sheets, readable at this writing (April 2004) at the following web site:

http://www.sma-inc.com/html/
    nitinol_technical_information.html Nitinol is available from suppliers, such as McMaster-Carr of Chicago, Ill., Small Parts in Miami Lake, Fla., or the Memry Corp. of Bethel, Conn. Here are some of the flavors in which Nitinol may be obtained:

BINARY ALLOYS Grade Nominal Content (*) Typical Applications:

BA 56.0 wt % Ni Balance Ti//Superelastic, high loading and unloading plateau stresses at low ambient temperatures. Ex.: cell phone antennae.

BB 55.8 wt % Ni Balance Ti//Superelastic; covers vast majority of applications and ambient and body temperatures. Ex: guidewires, needles, baskets, stents, etc.

SF 55.8 wt % Ni Balance Ti//A slight alloy variant from BB designed originally to maximize the flex life of antenna wire.

BC 55.75 wt % Ni Balance T//Superelastic; moderate plateau stresses; tightly controlled Af temperature.

BD 55.7 wt % Ni Balance T//Body temperature response behavior; martensitic close to ambient temperature and superelastic at body temperature.

B 55.0 wt % Ni Balance Ti//Thermal shape memory with recovery above 45 C.

BH 54.5 wt % Ni Balance Ti//Thermal shape memory with recovery above 70 C.

(*) C content less than 500 ppm, O less than 500 ppm. Total trace elements less than 0.4 wt %

According to this classification scheme, we used type BA for the embodiment having superelastic Nitinol rods in the range of 0.015"–0.020" diameter, and type BH for the embodiment having shape memory Nitinol rods in the range of 0.025" to 0.035" diameter.

There is also a family of copper alloys that exhibit memory behavior that is similar to the that of the Nitinol alloys. The literature suggest that these copper alloys are not as desirable as Nitinol, owing to issues such as embrittlement and cracking. Their memory properties are also not as pronounced as those of Nitinol, and their main virtues seem to be lower price. It seems that the copper alloys would also be suitable, in principle, although not as desirable.

I claim:

1. A hand held probe for electronic signals, comprising:

first and second pre-shaped rods of a material that resists bending until the application of an excessive force and that subsequently returns to its original shape in the absence of that excessive force;

a sleeve having first and second bores each sized to receive a respective one of the first and second rods, the axes of the bores being coplanar;

first and second contact assemblies each having a probe tip;

first and second conductive sockets each attached to a respective one of the first and second contact assemblies, the first and second sockets sized to receive respective first distal end portions of the first and second rods;

the probe tips of each of the first and second contact assemblies being displaced from the axis of the respective rod to which each contact assembly is attached;

a second distal end of each of the first and second rods being carried within the respective bore in the sleeve;

the first contact assembly being non-rotatable about the axis of the first rod;

the second contact assembly being rotatable about the axis of the second rod;

a spring coupled between the sleeve and the combination of the second rod, second socket and second contact assembly to resist force pushing the second rod into the second bore; and first and second conductors each respectively coupled at a distal end thereof to a corresponding one of the contact assemblies and coupleable at their other ends to electronic test equipment.

2. A hand held probe as in claim 1 wherein the first and second rods are of superelastic Nitinol.

3. A hand held probe as in claim 1 wherein the first and second sockets are of gold plated stainless steel tubing soldered to an edge of their respective first and second contact assemblies, and further wherein the first distal ends of the first and second rods are retained in the respective first and second sockets with an adhesive.

4. A hand held probe as in claim 1 further comprising a grip having a bore along an axis thereof and that receives the sleeve.

5. A hand held probe as in claim 1 wherein the contact assemblies are each circuit boards comprising a coupling network, and wherein each probe tip is inclined at an angle to the plane of its associated circuit board.

6. A hand held probe as in claim 5 wherein each coupling assembly further comprises a shield disposed over its associated coupling network and electrically connected to it associated socket.

7. A hand held probe as in claim 1 wherein the spring is a spiral compression spring disposed over the second rod and located between the second socket and the sleeve.

8. A hand held probe as in claim 1 wherein the sleeve has adjacent the first bore a notch for receiving a portion of the first contact assembly and the first contact assembly becomes non-rotatable upon engaging the notch.

9. A hand held probe as in claim 1 wherein the first and second rods are retained within their respective bores by friction caused by slight bends in the rods within those portions of those rods that enter the bores.

10. A hand held probe as in claim 1 wherein the first and second conductors are coaxial cables, and the grip further comprises at least one slot along the axis of the grip and that carries the coaxial cables.

11. A hand held probe as in claim 1 wherein the axes of the first and second bores are parallel and the first rod has, proximate an entrance to the first socket, a bend in the direction of the second socket, and touches the second socket proximate the probe tip of the second contact assembly.

12. A hand held probe as in claim 1 wherein the axes of the first and second bores are convergent, and the first and second sockets touch proximate the probe tips of the first and second contact assemblies.

13. A hand held probe for electronic signals, comprising:
first and second pre-shaped rods of a material that resists bending until the application of an excessive force and that subsequently returns to its original shape when heated above a transition temperature;
a sleeve having first and second bores each sized to receive a respective one of the first and second rods, the axes of the bores being coplanar;
first and second contact assemblies each having a probe tip;
first and second conductive sockets each attached to a respective one of the first and second contact assemblies, the first and second sockets sized to receive respective first distal end portions of the first and second rods;
the probe tips of each of the first and second contact assemblies being displaced from the axis of the respective rod to which each contact assembly is attached;
a second distal end of each of the first and second rods being carried within the respective bore in the sleeve;
the first contact assembly being non-rotatable about the axis of the first rod;
the second contact assembly being rotatable about the axis of the second rod;
a spring coupled between the sleeve and the combination of the second rod, second socket and second contact assembly to resist force pushing the second rod into the second bore; and
first and second conductors each respectively coupled at a distal end thereof to a corresponding one of the contact assemblies and coupleable at their other ends to electronic test equipment.

14. A hand held probe as in claim 13 wherein the first and second rods are of shape memory Nitinol.

15. A hand held probe as in claim 13 wherein the first and second sockets are of gold plated stainless steel tubing soldered to an edge of their respective first and second contact assemblies, and further wherein the first distal ends of the first and second rods are retained in the respective first and second sockets with an adhesive.

16. A hand held probe as in claim 13 further comprising a grip having a bore along an axis thereof and that receives the sleeve.

17. A hand held probe as in claim 13 wherein the contact assemblies are each circuit boards comprising a coupling network, and wherein each probe tip is inclined at an angle to the plane of its associated circuit board.

18. A hand held probe as in claim 17 wherein each coupling assembly further comprises a shield disposed over its associated coupling network and electrically connected to it associated socket.

19. A hand held probe as in claim 13 wherein the spring is a spiral compression spring disposed over the second rod and located between the second socket and the sleeve.

20. A hand held probe as in claim 13 wherein the sleeve has adjacent the first bore a notch for receiving a portion of the first contact assembly and the first contact assembly becomes non-rotatable upon engaging the notch.

21. A hand held probe as in claim 13 wherein the first and second rods are retained within their respective bores by friction caused by slight bends in the rods within those portions of those rods that enter the bores.

22. A hand held probe as in claim 13 wherein the first and second conductors are coaxial cables, and the grip further comprises at least one slot along the axis of the grip and that carries the coaxial cables.

23. A hand held probe as in claim 13 wherein the axes of the first and second bores are parallel and the first rod has, proximate an entrance to the first socket, a bend in the direction of the second socket, and touches the second socket proximate the probe tip of the second contact assembly.

24. A hand held probe as in claim 13 wherein the axes of the first and second bores are convergent, and the first and second sockets touch proximate the probe tips of the first and second contact assemblies.

25. A hand held probe for electronic signals, comprising:
first and second pre-shaped rods of superelastic Nitinol that resists bending until the application of an excessive force and that subsequently returns to its original shape in the absence of that excessive force;
a sleeve having first and second bores each sized to receive a respective one of the first and second rods;

first and second contact assemblies each having a probe tip, and each attached to a respective first distal end portion of the first and second rods;

the probe tips of each of the first and second contact assemblies being displaced from the axis of the respective rod to which each contact assembly is attached;

a second distal end of each of the first and second rods being carried within the respective bore in the sleeve;

the first contact assembly being non-rotatable about the axis of the first rod;

the second contact assembly being rotatable about the axis of the second rod;

a spring coupled between the sleeve and the combination of the second rod, second socket and second contact assembly to resist force pushing the second rod into the second bore;

first and second conductors each respectively coupled at a distal end thereof to a corresponding one of the contact assemblies and coupleable at their other ends to electronic test equipment; and the first distal end potions of the first and second rods being in electrical contact with each other at a location proximate the probe tips.

26. A hand held probe for electronic signals, comprising:

first and second pre-shaped rods of shape memory Nitinol that resists bending until the application of an excessive force and that subsequently returns to its original shape when heated above a transition temperature;

a sleeve having first and second bores each sized to receive a respective one of the first and second rods;

first and second contact assemblies each having a probe tip, and each attached to a respective first distal end portion of the first and second rods;

the probe tips of each of the first and second contact assemblies being displaced from the axis of the respective rod to which each contact assembly is attached;

a second distal end of each of the first and second rods being carried within the respective bore in the sleeve;

the first contact assembly being non-rotatable about the axis of the first rod;

the second contact assembly being rotatable about the axis of the second rod;

a spring coupled between the sleeve and the combination of the second rod, second socket and second contact assembly to resist force pushing the second rod into the second bore;

first and second conductors each respectively coupled at a distal end thereof to a corresponding one of the contact assemblies and coupleable at their other ends to electronic test equipment; and the first distal end potions of the first and second rods being in electrical contact with each other at a location proximate the probe tips.

* * * * *

UNITED STATES PATENT AND TRADEMARK OFFICE
CERTIFICATE OF CORRECTION

PATENT NO. : 6,949,919 B1  
APPLICATION NO. : 10/834549  
DATED : September 27, 2005  
INVENTOR(S) : Cannon It is certified that error appears in the above-identified patent and that said Letters Patent is hereby corrected as shown below:

On the Title page, (56), under "Other Publications", in column 1, line 3, after "Axis," insert -- Our case number 10020522-1; --.

In column 8, line 12, after "Balance" delete "T//" and insert -- Ti// --, therefor.

In column 8, line 14, after "Balance" delete "T//" and insert -- Ti// --, therefor.

In column 2, line 31, delete "ususal" and insert -- usual --, therefor.

In column 3, line 49, after "ends of" delete "the".

In column 5, line 14, after "or the" delete "an".

In column 8, line 23, after "wt %" insert -- . --.

Signed and Sealed this

Twenty-first Day of November, 2006

JON W. DUDAS  
*Director of the United States Patent and Trademark Office*